United States Patent [19]

Nishida

[11] Patent Number: 5,575,862
[45] Date of Patent: Nov. 19, 1996

[54] POLYCRYSTALLINE SILICON PHOTOELECTRIC CONVERSION DEVICE AND PROCESS FOR ITS PRODUCTION

[75] Inventor: Shoji Nishida, Fujisawa, Japan

[73] Assignee: Canon Kabushiki Kaisha, Tokyo, Japan

[21] Appl. No.: 352,034

[22] Filed: Nov. 30, 1994

[30] Foreign Application Priority Data

Nov. 30, 1993 [JP] Japan .................................. 5-299818
Nov. 25, 1994 [JP] Japan .................................. 6-291407

[51] Int. Cl.$^6$ ...................... H01L 31/06; H01L 31/0368; H01L 31/18
[52] U.S. Cl. .......................... 136/258; 257/51; 257/64; 437/4; 437/109; 437/119; 437/17; 437/173; 437/174; 437/967
[58] Field of Search ..................... 136/258 PC; 257/51, 257/64; 437/4, 109, 119, 173–174, 967

[56] References Cited

U.S. PATENT DOCUMENTS

| | | | |
|---|---|---|---|
| 4,124,410 | 11/1978 | Kotval et al. | 136/258 PC |
| 4,571,448 | 2/1986 | Barnett | 136/259 |
| 5,057,163 | 10/1991 | Barnett et al. | 136/258 PC |
| 5,455,430 | 10/1995 | Noguchi et al. | 257/53 |

FOREIGN PATENT DOCUMENTS

| | | | |
|---|---|---|---|
| 58-061681 | 4/1983 | Japan . | |
| 59-121829 | 7/1984 | Japan . | |
| 1-311511 | 12/1989 | Japan . | |
| 4-133356 | 5/1992 | Japan . | |
| 5-129639 | 5/1993 | Japan | 136/258 PC |
| 2047955 | 12/1980 | United Kingdom | 437/4 |

OTHER PUBLICATIONS

C. E. Norman et al, *Proceedings, 5th E.C. Photovoltaic Solar Energy Conf.*, Athens, Greece, Oct. 1983, pp. 1009–1013.

T. Warabisako et al, *Proceedings 1st E.C. Photovoltaic Solar Energy Conf.*, Luxembourg, Sep. 1977, pp. 187–196.

T. L. Chu et al, "Southeastcon '89", Proceedings vol. 3, Apr. 9–12, 1989.

"Photovoltaic Power Generation", Edited by R. Van Overstraelen et al, Kluwer Academic Publishers, pp. 174–179.

T. L. Chu et al, *Solar Energy Mat'ls*, vol. 2, pp. 265–275 (1979/1980).

P. V. Santos et al, *Conference Record, 17th IEEE Photovoltaic Specialists Conf.*, May 1984, pp. 1395–1397.

P. H. Robinson et al, *Conference Record, 14th IEEE Photovoltaic Specialists Conf.*, Jan. 1980, pp. 54–57.

*Electronic Design*, 11, vol. 25, p. 223, May 24, 1977.

B. F. Wagner, et al., "15.9% Efficiency for Si Thin Film Concentrator Solar Cell Grown By LPE," 23rd IEEE Photovolatic Specialists Conference, 1993.

Hamamoto et al, "Crystal Defects and Solar Cell Characteristics in Polycrystalline Si Thin Films", The Third Workshop on High–Efficiency Solar Cells in Toyama, 1992, pp. 20–23.

*Primary Examiner*—Aaron Weisstuch
*Attorney, Agent, or Firm*—Fitzpatrick, Cella, Harper & Scinto

[57] ABSTRACT

This invention provides an inexpensive polycrystalline silicon solar cell having a large grain size polycrystalline semiconductor layer grown on a low-cost metallurgical grade (MG) silicon substrate, and a process for its production. The polycrystalline silicon solar cell comprises a MG-silicon substrate, a metal oxide layer formed thereon and a polycrystalline silicon layer formed on the metal oxide layer. The process for producing the polycrystalline silicon solar cell comprises the steps of i) depositing the metal oxide layer on the MG-silicon substrate, ii) depositing a silicon layer on the surface of the metal oxide layer, iii) depositing a cap layer on the surface of the silicon layer and melting the silicon layer by heating from the upper part of the cap layer, followed by solidification to form a polycrystalline silicon layer, and iv) removing the cap layer and forming a semiconductor junction on the surface of the polycrystalline silicon layer.

34 Claims, 6 Drawing Sheets

IRRADIATION

FIG. 2C
IRRADIATION

POLYCRYSTALLINE SILICON PHOTOELECTRIC CONVERSION DEVICE AND PROCESS FOR ITS PRODUCTION

BACKGROUND OF THE INVENTION

1. Field of the Invention

This invention relates to a polycrystalline silicon photoelectric conversion device and a process for its production. More particularly it relates to a polycrystalline silicon photoelectric conversion device having a good energy conversion efficiency, and a process for its production.

2. Related Background Art

For use as an energy source for various equipment and as power sources connected with commercial power grids, solar cells serving as photoelectric conversion devices are the subject of much research.

Solar cells make use of pn junctions in their functional parts, and Si is commonly used as the semiconductor constituting the pn junctions. From the viewpoint of efficiency of converting light energy into electromotive force, it is preferred to use monocrystalline silicon. From the viewpoint of achievement of larger area and lower cost, amorphous silicon types are considered advantageous. In recent years, use of polycrystalline silicon has been studied for the purposes of achieving a low cost comparable to that of amorphous silicon types and a high energy conversion efficiency comparable to monocrystalline silicon types. In processes hitherto proposed, however, bulk polycrystal ingots are sliced into sheet members, and hence it is difficult to make their thickness not larger than 0.3 mm. Thus, they have too large a thickness to absorb light in a sufficient amount, resulting in unsatisfactorily effective utilization of materials. In other words, in order to achieve cost reduction, they must be made to have a much smaller thickness.

Accordingly, it has been attempted to form thin films of polycrystalline silicon by using thin-film forming techniques such as chemical vapor deposition (CVD), according to which, however, the crystal grain size is equal to the film thickness and can only be several-hundredths to scores of microns. Thus, under existing circumstances, such films have a low energy conversion efficiency also when compared with the products produced by slicing bulk polycrystalline silicon ingots.

Under such circumstances, it is also attempted to irradiate polycrystalline silicon thin films with laser light to melt them to effect recrystallization so that the crystal grain sizes are enlarged. This, however, cannot achieve satisfactory cost reduction and makes it difficult to stably carry out the manufacturing process. It has been proposed to form crystalline silicon films on low-cost substrates by zone melting recrystallization (ZMR) in a thickness large enough to absorb sunlight. Hamamoto et al., "Crystal Defects and Solar Cell Characteristics in Polycrystalline Si Thin Films", The Third Workshop on High-Efficiency Solar Cells in Toyama, 1992, p.20.

Figure 5:
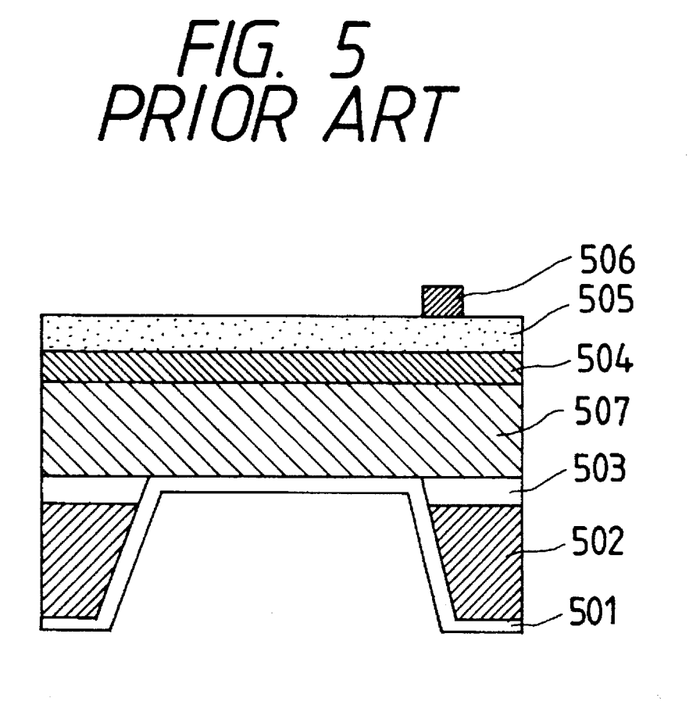
FIG. 5 is a cross section of a conventional thin-film polycrystalline silicon cell.

FIG. 5 cross-sectionally illustrates a solar cell fabricated by the above process. On a metallurgical grade silicon substrate 502, which is an inexpensive substrate with a low purity, an $SiO_2$ insulating layer 503 as an impurity barrier, a poly-Si (polycrystalline silicon) film 507, and an $SiO_2$ cap layer are formed in this order, and the thus formed laminate is subjected to zone melting recrystallization (ZMR) to increase the poly-Si film grain size. After the cap layer has been removed, silicon is epitaxially grown on this poly-Si layer by atmospheric pressure CVD. Thus, a polycrystalline silicon thin film 507 with a layer thickness of about 50 μm and a grain size of several mm to several cm is formed. A pn junction 504 is formed in film 507 by diffusion and an anti-reflection film 505 and a surface electrode 506 are further formed to produce a polycrystalline silicon thin film cell on the surface side. Thereafter, the silicon substrate 502 and also the $SiO_2$ insulating layer 503 are selectively removed by etching applied from the back to expose the back surface of the polycrystalline silicon thin film 507, and a back electrode 501 is formed thereon.

Thus, a polycrystalline silicon solar cell is produced through the above steps. However, the polycrystalline silicon solar cells fabricated by this process have a problem in that the energy conversion efficiency must be more improved. Moreover, according to this process, the polycrystalline silicon layer 507 and the substrate 502 are electrically insulated from each other because of the presence of the $SiO_2$ layer between them, and hence it is necessary to carry out an etchback from the back of the substrate 502 until the $SiO_2$ layer 502 is exposed, the $SiO_2$ layer being further removed to expose the back surface of the polycrystalline silicon layer 507 so that the electrode material can be deposited thereon to make electrical connection. Thus, this process has another problem of complicated processing steps.

SUMMARY OF THE INVENTION

An object of the present invention is to solve the above problems involved in the prior art to provide a polycrystalline silicon photoelectric conversion device formed of crystals with a large grain size and a good quality, and a process for its production.

The present invention provides a photoelectric conversion device comprising a metallurgical grade silicon substrate (hereinafter referred to as MG-Si), a metal oxide layer formed on the metallurgical grade silicon, and a polycrystalline silicon (hereinafter referred to as "poly-Si") layer formed on the metal oxide layer.

The present invention also provides a process for producing a polycrystalline silicon photoelectric conversion device, comprising the steps of:

forming a metal oxide layer on a metallurgical grade silicon substrate;

forming a silicon film on the metal oxide layer; and crystallizing the silicon film to form a polycrystalline silicon layer.

The invention thus constituted makes it possible to provide a polycrystalline silicon photoelectric conversion device that has good characteristics and can be fabricated with ease and to provide a process for producing such a device.

DESCRIPTION OF THE PREFERRED EMBODIMENTS

Figure 1A:
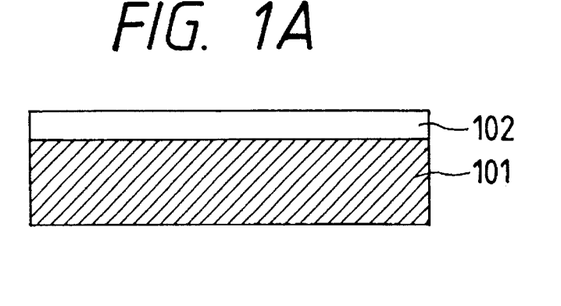
FIGS. 1A to 1D schematically illustrate a principal process for producing a thin-film polycrystalline silicon solar cell according to the present invention.
Figure 1B:
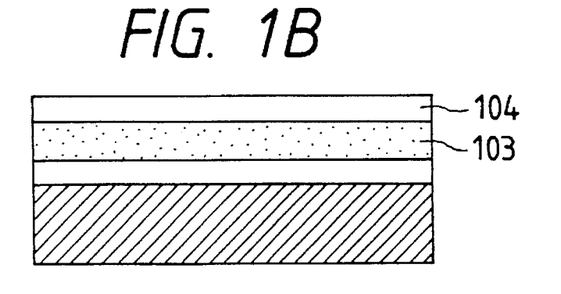
Figure 1C:
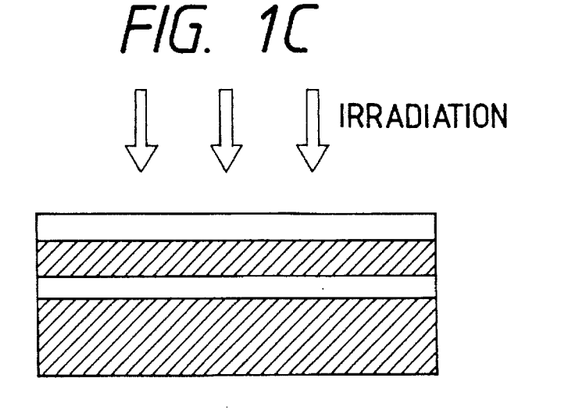
Figure 1D:
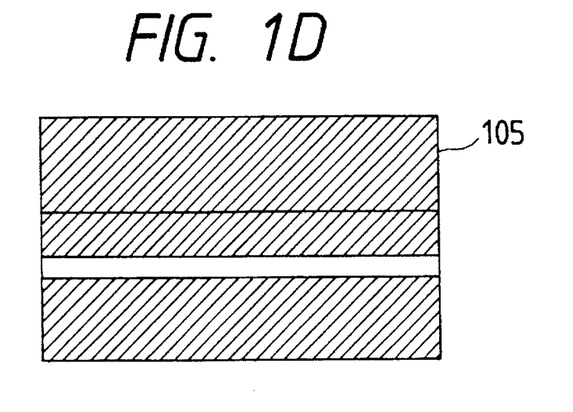

Operation of the present invention will be described with reference to FIGS. 1A to 1D. The technical features of the present invention are as follows: As shown in FIGS. 1A to 1D, (a) on a MG-Si substrate 101 a metal oxide layer 102 is deposited by a means such as sputtering (FIG. 1A), and thereafter, (b) a silicon layer 103 is formed by CVD or the like and a cap layer 104 comprising NSG (non-doped silica glass) or the like is further deposited thereon by CVD or the like (FIG. 1B). Then (c) the silicon layer is heated by lamp irradiation from the upper part and melted so as to effect recrystallization so that its grain size is enlarged (FIG. 1C), and also (d) optionally after removal of the cap layer a recrystallized silicon layer 105 thus formed is subjected to liquid-phase epitaxy to increase its thickness (FIG. 1D).

The present inventor has discovered that a polycrystalline silicon layer with a large grain size and a good film quality can be formed when a silicon layer deposited on a metal oxide such as ZnO is recrystallized by lamp heating, and thus has accomplished the present invention.

More specifically, it is presumed that in the step (c) of recrystallization there is not so much difference in the coefficient of thermal expansion between the Si layer, the metal oxide layer and the MG-Si substrate, and hence the stress applied to the recrystallized Si layer and the Si layer and the MG-Si is not a significant factor, so that good poly-Si and electrical properties can be obtained.

In addition, in the step (a), the use of the metal oxide (a metal oxide having electrical conductivity, such as ZnO) enables electrical connection between the recrystallized Si layer and the underlying MG-Si substrate, so that any time-consuming, troublesome steps such as the etchback of substrates that is required when a $SiO_2$ film is used become unnecessary.

The present invention will now be described below in detail.

Substrate 101

As the substrate 101 used in the present invention, a metallurgical grade silicon which can achieve electrical connection, has substantially the same coefficient of thermal expansion as that of high-purity silicon which is used as a semiconductor and has a low purity, specifically, contains 1 ppm to 2% of impurity elements, is inexpensive, and can be used with relative ease.

Metal Oxide Layer 102

The metal oxide used in the present invention may be selected from those having a melting point higher than that of silicon and having electrical conductivity. For example, ZnO, NiO, and $V_2O_3$ are used. In particular, ZnO is preferred in view of its ease of handling, a small difference in coefficient of thermal expansion with respect to Si and its minimal tendency to produce stress. Thickness of the metal oxide layer 102 depends on the materials of the metal oxide, melting and recrystallizing conditions, and so forth. The thickness is preferably in the range of from 0.5 to 10 μm.

The metal oxide layer also preferably has a specific electrical resistance of $10^{-3}$ to 1 Ω·cm.

Si layer 103 to be recrystallized The silicon layer deposited on the metal oxide layer 102 may be non-monocrystalline, i.e., amorphous or crystalline, or may be a mixture of amorphous and crystalline.

The silicon layer may be deposited by any process including atmospheric pressure CVD, LPCVD, plasma-assisted CVD such as high-frequency plasma-assisted CVD or microwave plasma-assisted CVD, photo-CVD, vapor deposition, and sputtering. The silicon layer preferably has a thickness in the range of from 0.5 to 50 μm.

The recrystallized silicon layer has a layer thickness of several tens of microns or less and a grain size of several hundreds of μm to several mm.

The maximum temperature during recrystallization is preferably set at 1,410° to 1,450° C., and is preferably maintained for 5 seconds to 120 seconds. When the melted silicon layer solidifies, the rate of temperature decrease is most important and is preferably from 0.1° to 5° C. per second.

Cap Layer 104

The cap layer 104 on the silicon layer 103 used in the process of the present invention is formed in order to prevent the deposited silicon layer from melting or evaporating. As layers that cause no deterioration of film quality of the deposited silicon layer, NSG, PSG (Phosphosilicate Glass), BSG (Borosilicate Glass), $Si_3N_4$, and ZnO, or any combination thereof, may be used. Such layers can be formed using an atmospheric pressure CVD reactor, a LPCVD reactor, or a sputtering apparatus. In particular, the use of PSG or BSG makes it possible also to dope the silicon layer with impurities during melting so as to determine its conductivity type. Thickness of the cap layer, which depends on the materials and combinations thereof, is preferably controlled in the range of from 1 to 5 μm.

Crystal Growth Process

The process for crystal growth used in the present invention may include LPE (liquid-phase epitaxy), LPCVD (low-pressure CVD), atmospheric pressure CVD, photo-CVD and sputtering. In view of growth rate and crystallinity, it is preferred to use liquid-phase epitaxy. The range of growth temperature in the liquid-phase epitaxy, which depends on the type of solvents, may preferably be controlled to be from 850° C. to 1,050° C. when Si and Sn are used as a solute and a solvent, respectively. The degree of super-cooling may preferably be several ° C. or so, and the rate of temperature drop may preferably be controlled in the range of from 0.1° to 5° C. per minute.

Impurities are doped into the surface of the resulting poly-Si for the purpose of forming a semiconductor junction therein. The impurities are doped by ion implantation or thermal diffusion, and are selected from P, As, Sb, etc. as n-type impurities and B, Al, etc. as p-type impurities. Alternatively, a semiconductor layer having a conductivity type different from that of the poly-Si may be deposited on the surface of the poly-Si. The depth of such junction or thickness of the semiconductor layer, which depends on the quantity of impurities doped, may suitably be in the range of from 0.01 to 1 μm, and more preferably from 0.02 to 0.5 μm.

In view of the requirements for the characteristics of solar cells, it is suitable for the recrystallized Si layer or poly-Si layer formed by a crystal growth process to have a final layer thickness of from 10 to 200 μm, and more preferably from 20 to 200 μm.

Experiment 1

Figure 2A:
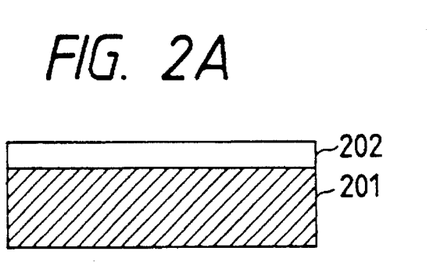
FIGS. 2A to 2E schematically illustrate another process for producing a thin-film polycrystalline silicon solar cell according to the present invention.

Melting and recrystallizing silicon layers on metal oxides:

Referring to FIGS. 2A–2E, on the surface of a 0.5 mm thick MG-Si substrate 201, ZnO was deposited by conventional sputtering a thickness of 2 μm as a metal oxide layer 202 (FIG. 2A).

Figure 2B:
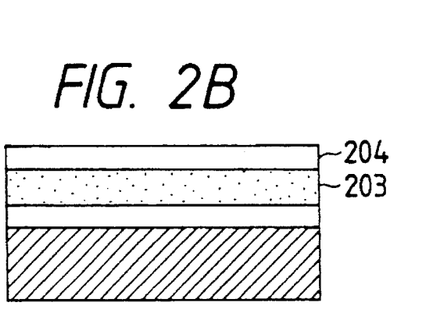

On the layer thus formed, a silicon layer 203 was deposited in a thickness of 6 μm using a conventional vacuum deposition reactor. The Si layer thus formed was examined by X-ray diffraction, which revealed that it was amorphous silicon. On such a Si layer formed on the MG-Si substrate, an NSG film 204 was deposited as a cap layer in a thickness of 2 μm using an atmospheric pressure CVD reactor (FIG. 2B).

Figure 2C:
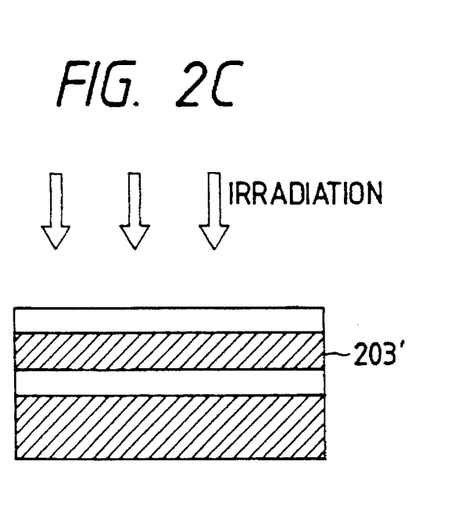
Figure 3A:
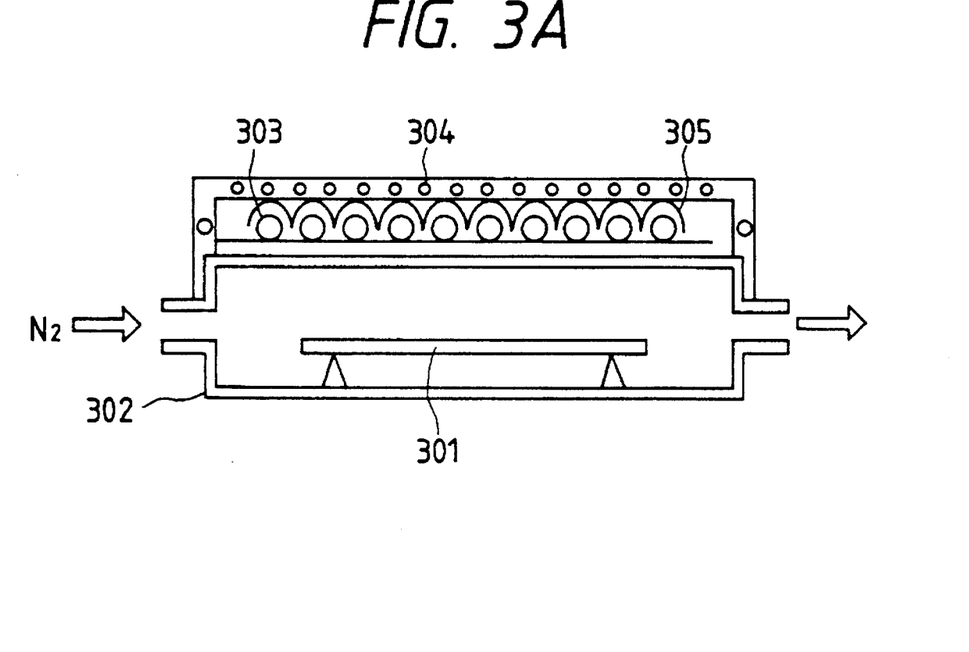
FIGS. 3A and 3C schematically illustrate lamp irradiation devices used in the process of the present invention.
Figure 3B:
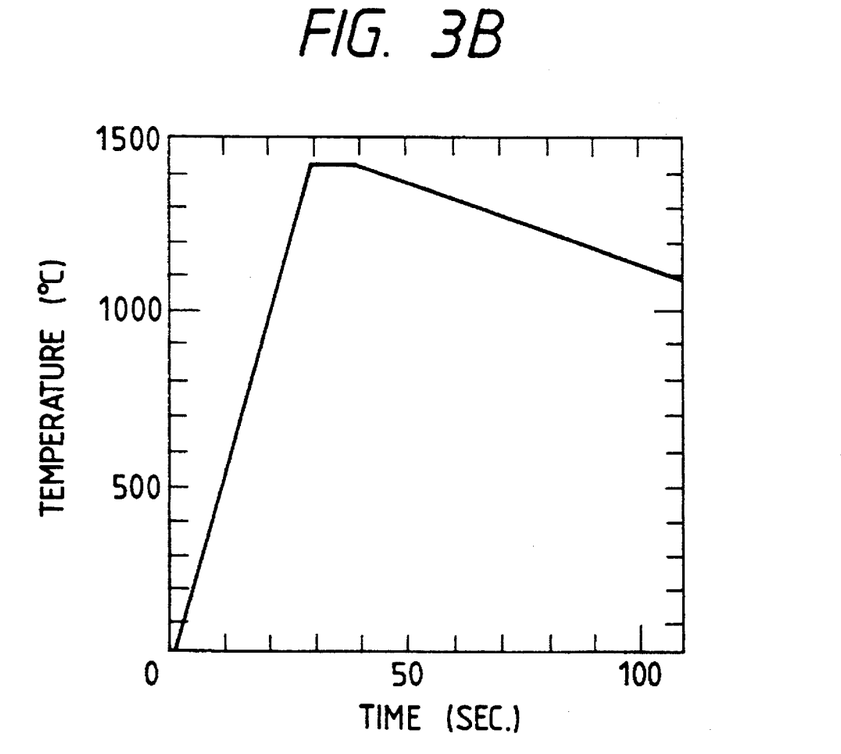
FIGS. 3B and 3D are graphs to show examples of temperature variation profiles during heating.

Next, the Si layer was melted by light irradiation using a halogen lamp to effect recrystallization (FIG. 2C). A schematic view of a lamp irradiation device and the temperature sequence for melting and recrystallizing the Si layer as used in this step are shown in FIGS. 3A and 3B, respectively. In FIG. 3A, reference numeral 301 denotes a substrate; 302, a quartz chamber; 303, a lamp; 304, conduits for flowing cooling water; and 305, a reflector.

After the light irradiation was completed, the NSG film on a recrystallized Si layer 203' was removed with hydrofluoric acid, and the surface and cross section of the recrystallized Si layer were observed using an optical microscope and a scanning electron microscope to confirm that a relatively smooth Si layer was obtained and its layer thickness was substantially the same as that before melting. Crystal grain boundaries were accentuated by Secco etching to reveal that the grain size of the recrystallized Si layer 203' had been enlarged to a maximal size of several mm and also the density of etch pits on the surface of the Si layer were about $10^5/cm^2$.

Experiment 2

In the same manner as in Experiment 1, NiO was deposited on the MG-Si substrate 201 by conventional sputtering in a thickness of 2 μm to form the metal oxide layer 202, and the Si layer 203 was deposited thereon in a thickness of 8 μm using a conventional vacuum deposition reactor and then melted by lamp heating to effect recrystallization. In this instance also, a similar recrystallized Si layer was obtained.

Experiment 3

Figure 2D:
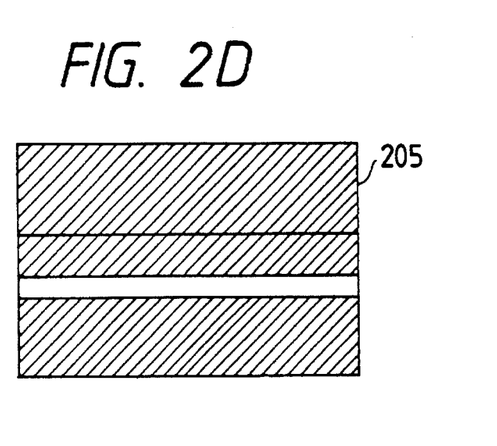

On the crystallized Si layer obtained in Experiment 1, further crystal growth was made by liquid-phase epitaxy. The crystal growth was made using a conventional slide type liquid-phase epitaxy assembly and using Sn and Si as a solvent and a solute, respectively, at a growth initiation temperature of 950° C., a super-cooling degree of 3° C. and a temperature drop rate of 0.5° C./min and for a growth time of 60 minutes (FIG. 2D). After the epitaxy was completed, the surface and cross section of the growth layer were observed in the same manner as in Experiment 1, using an optical microscope and a scanning electron microscope to confirm that a relatively smooth Si layer 205 was obtained and its layer thickness was about 50 μm. Its grain size also assumed the size of the underlying recrystallized Si layer and also the density of etch pits on the surface of the Si layer thus grown were about $5 \times 10^4$ pits/$cm^2$.

Experiment 4

Figure 2E:
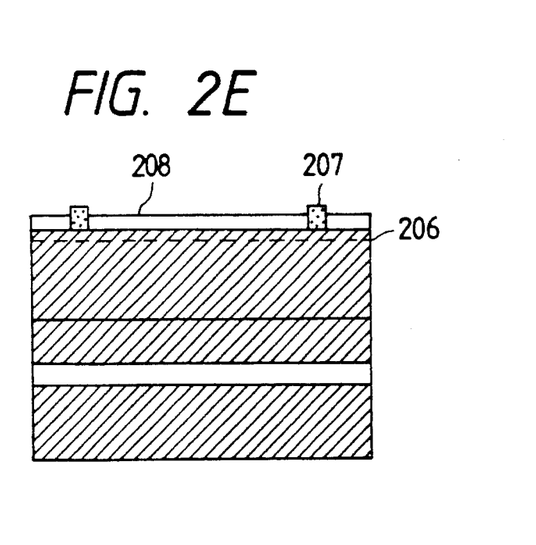

Phosphorus (P) ions were implanted into the surface portion of the large grain size Si crystal thin film on the MG-Si substrate obtained in experiment 3, by ion implantation under conditions of 80 keV and $1 \times 10^{15}$ ions/$cm^2$, followed by annealing at 800° C. for 30 minutes to form an $n^+$-layer 206. Then, on that layer, collector electrodes 207 (Cr: 0.02 μm/Ag: 1 μm/Cr: 0,004 μm) and a transparent electrode 208 (ITO: 0,085 μm) were formed by vacuum deposition (FIG. 2E).

For solar cells produced in this way, having the structure of large grain size Si crystal thin film—Zno—MG-Si, the I-V characteristics under light irradiation of AM 1.5 (100 mW/$cm^2$) were measured. As a result, for a cell are of 2 $cm^2$, the open-circuit voltage was 0.55 V, the short-circuit photocurrent was 32 mA/$cm^2$, the fill factor was 0.75, and the conversion efficiency was 13.2%.

Thus, it was demonstrated that a large grain size Si thin film can be formed by superposingly forming the metal oxide layer and the Si layer on the MG-Si substrate and melting the Si layer by lamp irradiation to effect recrystallization, and thus a solar cell (photovoltaic device, Device-1) having good characteristics could be fabricated.

Experiment 5

For comparison, a recrystallized Si layer was formed in the same manner as in Experiment 1 except that the metal oxide layer 202 was replaced with a layer formed of $SiO_2$. The surface and cross section of the recrystallized Si layer were observed to reveal that a relatively flat Si layer was obtained like that in Experiment 1 but the density of etch pits formed by Secco etching was as large as $10^7$ pits/$cm^2$.

Experiment 6

A solar cell (Device-2) was fabricated using the product obtained in Experiment 5, under the same conditions as in Experiment 4.

To compare Device-1 obtained in Experiment 4 with Device-2 obtained in Experiment 6, electrical connections were provided as follows: The MG-Si, $SiO_2$, and ZnO of Device-1 and Device-2 beneath the device were partly removed, and thereafter metal electrodes were formed. It was found that Device-1 exhibited a conversion efficiency about twice that of Device-2 and the film quality of the recrystallized Si layers greatly influenced the characteristics of the solar cells.

Fabrication of the desired solar cells by carrying out the process of the present invention will be described below in greater detail by means of Examples. The present invention is by no means limited by these Examples.

EXAMPLE 1

A large grain size polycrystalline Si solar cell was produced on a MG-Si substrate in the same manner as in Experiment 4.

On the surface of a 0.5 mm thick MG-Si substrate, Zno was deposited by conventional sputtering to form a metal oxide layer in a thickness of 2 μm. On this layer, an n-type Si layer was deposited in a thickness of 20 μm using a conventional vacuum deposition reactor. The Si layer thus formed was examined by X-ray diffraction to reveal that it was amorphous silicon. On the Si layer formed on such a MG-Si substrate, an NSG film was deposited as a cap layer in a thickness of 2 μm using an atmospheric pressure CVD reactor, followed by light irradiation using a halogen lamp (25 kW) as a heat source for recrystallization, according to the temperature sequence as shown in FIG. 3B, so as to melt the Si layer to effect recrystallization.

After the light irradiation was completed, the NSG film on the recrystallized Si layer was removed with an aqueous solution of hydrofluoric acid, and then boron ions (B) were implanted into the surface portion of the Si crystal thin film by ion implantation under conditions of 20 keV and $1\times10^{15}$ ions/cm$^2$, followed by annealing at 800° C. for 20 minutes to form a p$^+$-layer. Then collector electrodes (Ti/Pd/Ag: 0.04 µm/0.02 µm/1 µm) and an ITO transparent electrode 0.085 µm) were formed on the p$^+$-layer.

For solar cells produced in this way, having the structure of large grain size Si crystal thin film—ZnO—MG-Si, the I-V characteristics under light irradiation of AM 1.5 (100 mW/cm$^2$) were measured. As a result, for a cell area of 2 cm$^2$, the open-circuit voltage was 0.56 V, the short-circuit photocurrent was 25 mA/cm$^2$, the fill factor was 0.74, and the conversion efficiency was 10.4%.

EXAMPLE 2

A polycrystalline Si solar cell having an n$^+$p junction was produced in the same manner as in Example 1. FIGS. 2A to 2E show its fabrication process.

As the metal oxide layer 202, ZnO was deposited by conventional sputtering in a thickness of 2 µm on the surface of a 0.5 mm thick MG-Si substrate 201 (FIG. 2A).

On the layer thus formed, a silicon layer 203 was deposited in a thickness of 10 µm using a conventional LPCVD reactor. The Si layer thus formed was examined by X-ray diffraction to reveal that it was polycrystalline Si having a grain size of about 8 nm. On such a Si layer formed on the MG-Si substrate, a BSG film was deposited as a cap layer 204 and also as a layer determining the conductivity type of the Si layer, in a thickness of 2 µm using an atmospheric pressure CVD reactor (FIG. 2B).

Next, using the lamp irradiation device as shown in FIG. 3A, the Si layer was melted by light irradiation of halogen lamps (25 kW) according to the temperature sequence as shown in FIG. 3B, to effect recrystallization (FIG. 2C).

Thereafter, the NSG film was removed with an about 5% aqueous solution of hydrofluoric acid, and then crystal growth was made using a conventional liquid-phase epitaxy assembly of a slide type boat system and using Sn as a solvent, under conditions as shown below, to obtain a large grain size Si crystal thin film 205 (FIG. 2D). The above epitaxy was carried out in an atmosphere of hydrogen at a growth initiation temperature of 950° C., a super-cooling degree of 3° C., a temperature drop rate of 0.5° C./min and for a growth time of 55 minutes (FIG. 2D). The Si crystal thin film and recrystallized Si layer thus obtained had a total layer thickness of about 50 µm.

Next, phosphorus (P) was thermally diffused into the surface of the Si crystal layer at a temperature of 900° C. using POCl$_3$ as a diffusion source to form an n$^+$-layer 206 and obtain a junction at a depth of about 0.5 µm. The dead layer produced by the thermal diffusion on the n$^+$-layer thus formed was removed by etching to obtain a junction at a depth of about 0.2 µm having an appropriate surface density of phosphorus. On the n$^+$-layer, collector electrodes 207 and an ITO transparent electrode 208 were formed in the same manner as in Example 1 (FIG. 2E).

For solar cells produced in this way, having the structure of n$^+$-Si—p-Si crystal thin film—ZnO—MG-Si, the I-V characteristics under light irradiation of AM 1.5 (100 mW/cm$^2$) were measured. As a result, for a cell area of 2 cm$^2$, the open circuit voltage was 0.56 V, the short-circuit photocurrent was 34 mA/cm$^2$, the fill factor was 0.73, and the conversion efficiency was 13.9%.

EXAMPLE 3

A p$^+$-microcrystalline silicon/polycrystalline silicon heterojunction type solar cell was produced in the same manner as in Examples 1 and 2. FIGS. 4A to 4E show the fabrication process of the heterojunction type solar cell.

Figure 4A:
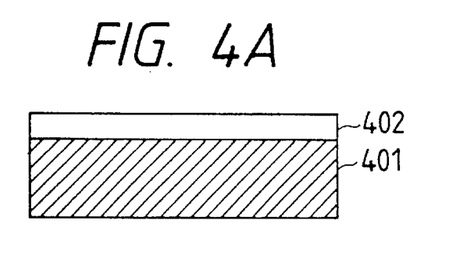
FIGS. 4A to 4E schematically illustrate a process for producing a heterojunction type solar cell.
Figure 4B:
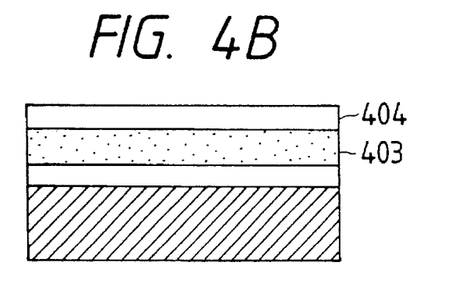
Figure 4C:
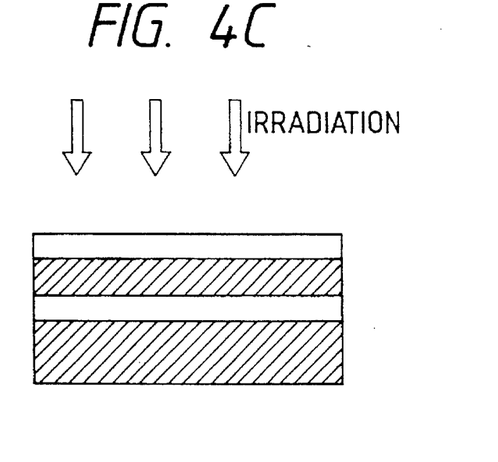

First, ZnO 402 was deposited by reactive sputtering in a thickness of 2 µm on the surface of a MG-Si substrate 401 (FIG. 4A). On that layer, a silicon layer 403 was further deposited in a thickness of 12 µm by LPCVD, and a PSG film 404 was deposited thereon in place of the BSG film 204 in Example 2, as a cap layer and as a layer determining the conductivity type of the Si layer, in a thickness of 2 µm using an atmospheric pressure CVD reactor (FIG. 4B). Then, the Si layer was melted by light irradiation of halogen lamps (25 kW) according to the temperature sequence as shown in FIG. 3B, to effect recrystallization (FIG. 4C). As shown in FIG. 3B, after 100 seconds, the temperature may be dropped in the same way or, in view of improvement in production efficiency, the film may be quenched.

Figure 4D:
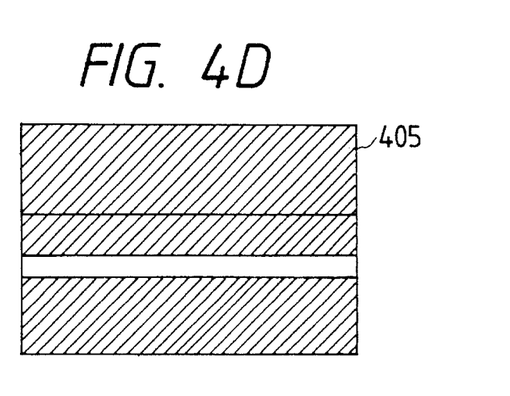

After the NSG film was removed with an aqueous solution of hydrofluoric acid, crystal growth was made using a conventional liquid-phase epitaxy assembly of a slide type boat system using Sn as a solvent and Si as a solute (0.48% by weight) in an atmosphere of hydrogen at a growth initiation temperature of 950° C., a super-cooling degree of 3° C., a temperature drop rate of 0.5° C./min, and a growth time of 55 minutes (FIG. 4D). The Si crystal thin film and recrystallized Si layer 405 thus obtained had a final layer thickness of about 50 µm.

Figure 4E:
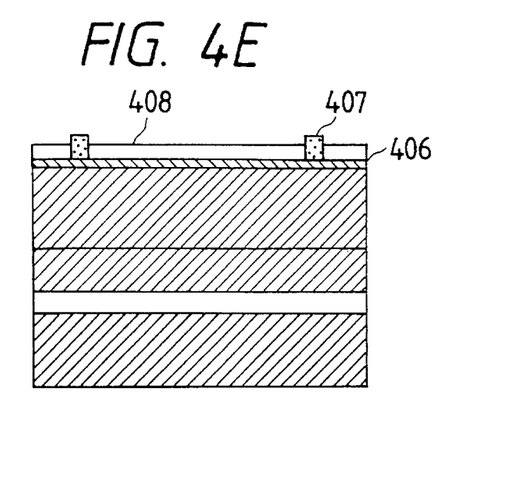

Subsequently, in place of the n$^+$-layer 206 in Example 2, a p-type microcrystalline Si layer 406 was formed on the Si crystal layer 405. The p-type microcrystalline Si layer was deposited on the Si crystal surface in a thickness of 0.02 µm using a conventional plasma-assisted CVD reactor under conditions as shown in Table 1 below. The microcrystalline Si film thus formed had a dark conductivity of about 10S cm$^1$.

TABLE 1

| Gas flow rate ratio | Substrate Temperature | Pressure | Discharge Power |
|---|---|---|---|
| SiH$_4$/H$_2$: 1 cc/20 cc | 250° C. | 0.5 Torr | 20 W |
| B$_2$H$_6$/SiH$_4$: 2 × 10$^{-3}$ | | | |

As a transparent conductive film 408, ITO was formed by electron beam deposition in a thickness of about 0.1 µm. Collector electrodes 407 (Cr: 0.02 µm/Ag: 1 µm/Cr: 0.004 µm) were formed by vacuum deposition (FIG. 4E). For p$^+$-microcrystalline silicon/polycrystalline silicon heterojunction type solar cells produced in this way, the I-V characteristics under light irradiation of AM 1.5 were measured. As a result, for a cell area of 1.6 cm$^2$, the open-circuit voltage was 0.60 V, the short-circuit photocurrent was 35.2 mA/cm$^2$, the fill factor was 0.68, and the conversion efficiency was as high as 14.4%.

EXAMPLE 4

A large grain size Si solar cell was produced in the same manner as in Example 1 according to the process as shown in FIG. 2.

In the manner as previously described, ZnO was deposited on the surface of a MG-Si substrate by sputtering in a thickness of 3 μm. On the ZnO layer thus formed, an n-type Si layer was deposited in a thickness of 40 μm using a conventional atmospheric pressure CVD reactor. Next, an NSG film was deposited as a cap layer in a thickness of 2 μm using an atmospheric pressure CVD reactor, followed by light irradiation using a halogen lamp according to the temperature sequence as shown in FIG. 3B, so as to melt the Si layer to effect recrystallization. After the light irradiation was completed, the NSG film on the recrystallized Si layer was removed with an aqueous solution of hydrofluoric acid. In order to form p+-layer on the surface of the Si crystal thin film, BSG was deposited using an atmospheric pressure CVD reactor, followed by RTA (Rapid Thermal Annealing). The BSG deposited was in a layer thickness of about 0.6 μm and the RTA was carried out under conditions of 1,050° C. for 60 seconds. The junction thus formed was of a depth of about 0.2 μm.

After the BSG was removed with an aqueous solution of hydrofluoric acid, the surface of the Si crystal layer was thinly oxidized (about 0.01 μm) by dry oxidation, and the formed oxide film was etched in the form of a fine grid pattern by photolithography. Collector electrodes (Ti/Pd/Ag: 0.04 μm/0.02 μm/1 μm) and an ITO transparent electrode (0.085 μm) were then formed on the $p^+$-layer by electron beam deposition using a metal mask.

For crystalline thin-film solar cells produced in this way, the I-V characteristics under light irradiation of Am 1.5 were measured. As a result, for a cell area of 2.5 cm$^2$, the open-circuit voltage was 0.58 V, the short-circuit photocurrent was 35 mA/cm$^2$, the fill factor was 0.72, and the conversion efficiency was 14.6%.

EXAMPLE 5

A large grain size Si solar cell was produced in the same manner as in Example 1 according to the process as shown in FIG. 2.

In the manner as previously described, NiO was deposited on the surface of MG-Si substrate by sputtering in a thickness of 3 μm. On the surface of the NiO layer thus formed, an n-type Si layer was deposited in a thickness of 40 μm using an atmospheric pressure CVD reactor. Next, a ZnO film was deposited as a cap layer in a thickness of 2 μm using a sputtering reactor, followed by light irradiation by halogen lamps using the device as shown in FIG. 3C, according to the temperature sequence as shown in FIG. 3D, so as to melt the Si layer to effect recrystallization.

Figure 3C:
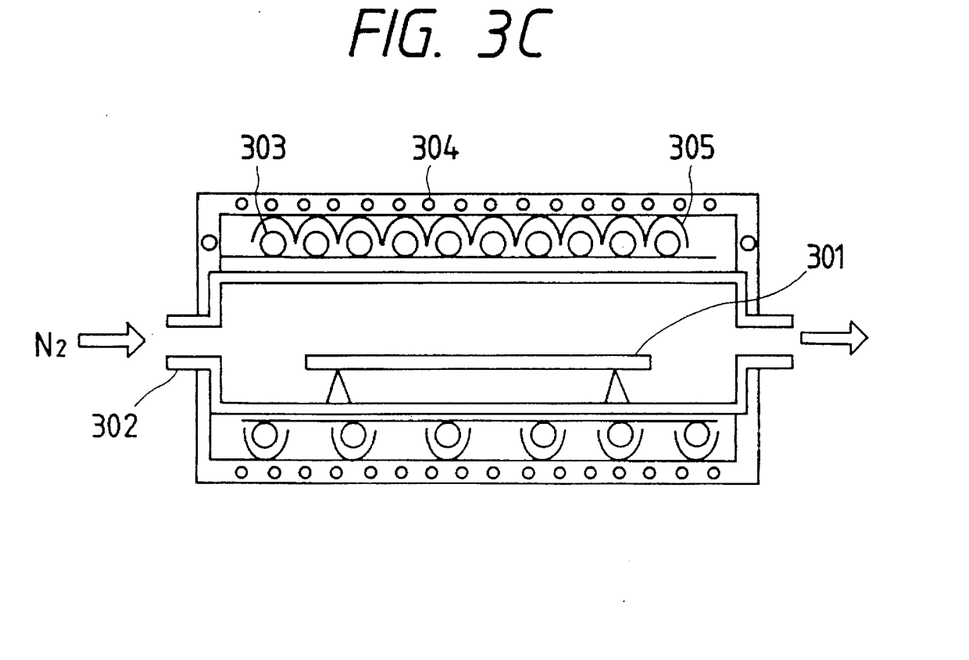
Figure 3D:
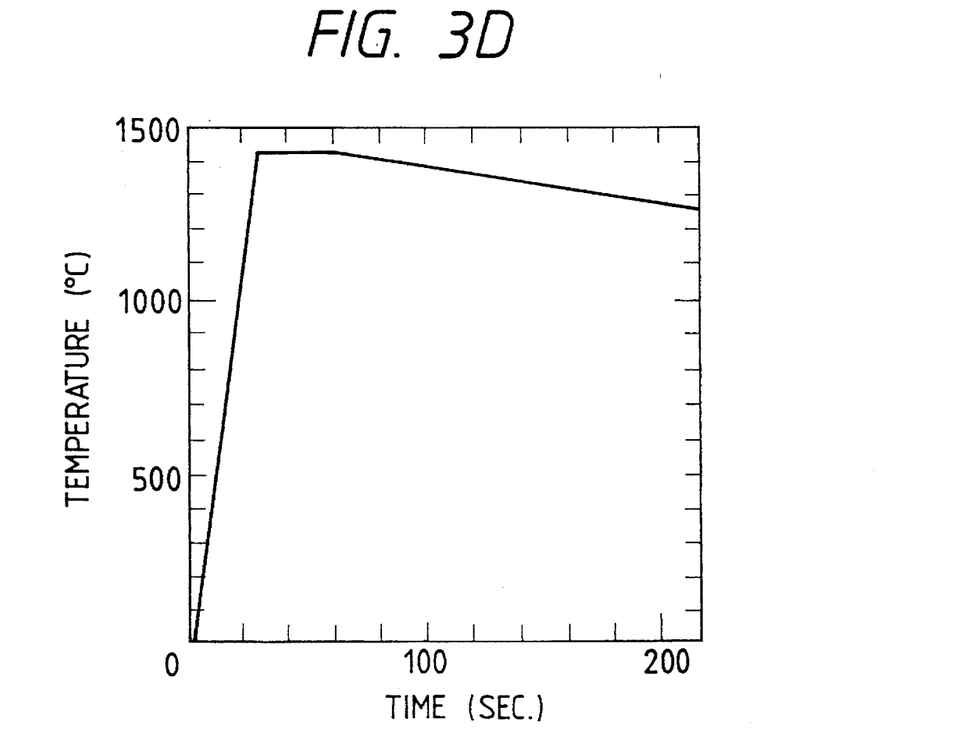

In the device shown in FIG. 3C, heat sources are provided unsymmetrically in the upper and lower directions (light intensity on the upper side is greater than light intensity on the lower side). Hence, the Si layer can be efficiently recrystallized while preventing the MG-Si from melting.

After the light irradiation was completed, the ZnO film on the recrystallized Si layer was removed with an aqueous solution of hydrochloric acid. In order to form a $p^+$-layer on the surface of the recrystallized Si thin film, BSG was deposited using an atmospheric pressure CVD reactor, followed by RTA (Rapid Thermal Annealing). The BSG was deposited in a layer thickness of about 0.6 μm and the RTA was carried out under conditions of 1,050° C. for 60 seconds. The junction thus formed was at a depth of about 0.2 μm.

After the BSG was removed with an aqueous solution of hydrofluoric acid, the surface of the Si crystal layer was thinly oxidized (about 0.01 μm) by dry oxidation, and the formed oxide film was etched in the form of a fine grid pattern by photolithography. Collector electrodes (Ti/Pd/Ag: 0.04 μm/0.02 μm/1 μm) and an ITO transparent electrode (0.085 μm) were the formed on the $p^+$-layer by electron beam deposition using a metal mask.

Characteristics of crystal thin-film solar cells produced in this way were measured. As a result, the same characteristics as in Example 4 were obtained.

As described above, according to the present invention, it has been shown that large grain size Si thin films can be formed when the Si layer deposited on the metal oxide layer on the MG-Si substrate is melted by lamp irradiation to effect recrystallization, and inexpensive solar cells with a mass productivity can be produced by the use of such thin films.

According to the present invention, it has also become possible to fabricate crystalline thin-film solar cells with good characteristics, on MG-Si substrates through a simple process. This makes it possible to commercially provide inexpensive, a good-quality thin-film type solar cells with a mass productivity.

What is claimed is:

1. A photoelectric conversion device comprising a metallurgical grade silicon substrate, a metal oxide layer provided on the metallurgical grade silicon substrate, selected from at least one of ZnO, NiO, and $V_2O_3$ and having a layer thickness of from 0.5 to 10 μm, and a polycrystalline silicon semiconductor layer on the metal oxide layer.

2. The photoelectric conversion device according to claim 1, wherein said metallurgical grade silicon substrate has an impurity density in the range of from 1 ppm to 2%.

3. The photoelectric conversion device according to claim 1, wherein said metal oxide layer has a specific resistance of from $10^{-3}$ to 1 Ωcm.

4. The photoelectric conversion device according to claim 1, wherein said polycrystalline silicon semiconductor layer has a layer thickness of from 10 to 200 μm.

5. The photoelectric conversion device according to claim 1, wherein said polycrystalline silicon semiconductor layer is provided with a semiconductor junction.

6. The photoelectric conversion device according to claim 5, wherein said semiconductor junction is a pn junction.

7. The photoelectric conversion device according to claim 1, wherein said polycrystalline silicon semiconductor layer has a grain size of from about several hundred μm to several mm.

8. The photoelectric conversion device according to claim 1, wherein said polycrystalline silicon semiconductor layer is provided thereon with a non-monocrystalline semiconductor layer.

9. The photoelectric conversion device according to claim 8, wherein said non-monocrystalline semiconductor layer is a microcrystalline semiconductor.

10. A process for producing a photoelectric conversion device, comprising the steps of:

forming on a metallurgical grade silicon substrate a metal oxide layer selected from at least one of ZnO, NiO, and $V_2O_3$ and having a layer thickness of from 0.5 to 10 μm;

forming a silicon film on the metal oxide layer; and heating the silicon film thus formed, thereby forming a polycrystalline silicon semiconductor film on the metal oxide layer.

11. The process for producing a photoelectric conversion device according to claim 10, wherein said heating is supplied by lamp heating.

12. The process for producing a photoelectric conversion device according to claim 10, wherein said heating is supplied from the silicon film side.

13. The process for producing a photoelectric conversion device according to claim 10, wherein said heating is supplied from the silicon film side and a smaller amount of heat energy is supplied from the metallurgical grade silicon substrate side.

14. The process for producing a photoelectric conversion device according to claim 10, wherein a semiconductor junction is formed in or on said polycrystalline silicon semiconductor film.

15. The process for producing a photoelectric conversion device according to claim 14, wherein said semiconductor junction is formed by doping said polycrystalline silicon film with impurities.

16. The process for producing a photoelectric conversion device according to claim 14, wherein said semiconductor junction is formed by providing on said polycrystalline silicon semiconductor film a semiconductor layer containing impurities.

17. The process for producing a photoelectric conversion device according to claim 16, wherein said semiconductor layer containing impurities is non-monocrystalline.

18. The process for producing a photoelectric conversion device according to claim 17, wherein said non-monocrystalline semiconductor is microcrystalline.

19. The process for producing a photoelectric conversion device according to claim 14, wherein said semiconductor junction is a pn junction.

20. The process for producing a photoelectric conversion device according to claim 10, wherein a non-monocrystalline semiconductor layer is formed on said polycrystalline silicon semiconductor film.

21. The process for producing a photoelectric conversion device according to claim 20, wherein said non-monocrystalline semiconductor layer is microcrystalline.

22. The process for producing a photoelectric conversion device according to claim 20, wherein a pn junction is formed between said polycrystalline silicon semiconductor film and said non-monocrystal semiconductor layer.

23. The process for producing a photoelectric conversion device according to claim 10, which further comprises the steps of:

forming a cap layer on said silicon film; and removing the cap layer after the step of crystallization.

24. The process for producing a photoelectric conversion device according to claim 23, wherein said polycrystalline silicon semiconductor film is made to have a larger thickness by a crystal growth process carried out after removing said cap layer.

25. The process for producing a photoelectric conversion device according to claim 24, wherein said crystal growth process is liquid-phase epitaxy.

26. The process for producing a photoelectric conversion device according to claim 25, wherein said liquid-phase epitaxy employs Sn as a solvent and Si as a solute.

27. The process for producing a photoelectric conversion device according to claim 25, wherein said liquid-phase epitaxy is carried out at a growth temperature of from 850° C. to 1,050° C.

28. The process for producing a photoelectric conversion device according to claim 23, wherein said cap layer is formed of a material selected from at least one of NSG, PSG, BSG, $Si_3N_4$, and ZnO.

29. The process for producing a photoelectric conversion device according to claim 23, wherein said cap layer has a thickness of from 1 to 5 μm.

30. The process for producing a photoelectric conversion device according to claim 10, wherein the heating is controlled at a temperature drop rate of from 0.1° to 5° C./sec.

31. The process for producing a photoelectric conversion device according to claim 10, wherein said metallurgical grade silicon substrate has an impurity density in the range of from 1 ppm to 2%.

32. The process for producing a photoelectric conversion device according to claim 10, wherein said metal oxide layer has a specific resistance of from $10^{-3}$ to 1 Ω·cm.

33. The process for producing a photoelectric conversion device according to claim 10, wherein said polycrystalline silicon semiconductor film has a layer thickness of from 10 to 200 μm.

34. The process for producing a photoelectric conversion device according to claim 10, wherein said polycrystalline silicon semiconductor film has a grain size of from about several hundred μm to several mm.

* * * * *

UNITED STATES PATENT AND TRADEMARK OFFICE
CERTIFICATE OF CORRECTION

PATENT NO. : 5,575,862
DATED : November 19, 1996
INVENTOR(S) : SHOJI NISHIDA

It is certified that error appears in the above-indentified patent and that said Letters Patent is hereby corrected as shown below:

ON TITLE PAGE

[56] References Cited - OTHER PUBLICATIONS

Under "B.F. Wagner et al." - "tovolatic" should read --tovoltaic.

COLUMN 1

Line 50, "It" should read --¶ It--.

COLUMN 2

Line 20, "SiO$_2$ layer 502" should read --SiO$_2$ layer 503--.

COLUMN 3

Line 10, "The" should read --¶ The--;
Line 66, "recrystallized The" should read --recrystallized. ¶ The--.

COLUMN 5

Line 1, "sputtering" should read --sputtering in--;

UNITED STATES PATENT AND TRADEMARK OFFICE
CERTIFICATE OF CORRECTION

PATENT NO. : 5,575,862
DATED : November 19, 1996
INVENTOR(S) : SHOJI NISHIDA

It is certified that error appears in the above-indentified patent and that said Letters Patent is hereby corrected as shown below:

COLUMN 5

Line 65, "experiment 3," should read --Experiment 3,--.

COLUMN 6

Line 3, "0,085 μm)" should read --0.085μm)--;
Line 8, "are" should read --area--;
Line 55, "Zno" should read --ZnO--.

COLUMN 7

Line 8, "0.085" should read --(0.085--.

COLUMN 8

Line 54, "For" should read --¶ For--.

COLUMN 9

Line 10, "After" should read --¶ After--;
Line 13, "p+-layer" should read --$p^+$-layer--;
Line 29, "Am 1.5" should read --AM 1.5.--.

UNITED STATES PATENT AND TRADEMARK OFFICE
CERTIFICATE OF CORRECTION

PATENT NO. : 5,575,862
DATED : November 19, 1996
INVENTOR(S) : SHOJI NISHIDA

It is certified that error appears in the above-indentified patent and that said Letters Patent is hereby corrected as shown below:

COLUMN 10

Line 5, "(0,085 $\mu$m) were the" should read --(0.085$\mu$m) were then--.

COLUMN 11

Line 41, "non-monocrystal" should read --non-monocrystalline--.

Signed and Sealed this

Tenth Day of June, 1997

Attest:

BRUCE LEHMAN

*Attesting Officer*     *Commissioner of Patents and Trademarks*